United States Patent
Kim et al.

(10) Patent No.: US 8,471,613 B2
(45) Date of Patent: Jun. 25, 2013

(54) INTERNAL CLOCK SIGNAL GENERATOR AND OPERATING METHOD THEREOF

(75) Inventors: Yong-Hoon Kim, Gyeonggi-do (KR); Hyun-Woo Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 185 days.

(21) Appl. No.: 12/648,674

(22) Filed: Dec. 29, 2009

(65) Prior Publication Data

US 2011/0156778 A1    Jun. 30, 2011

(30) Foreign Application Priority Data

Dec. 28, 2009    (KR) .................. 10-2009-0132039

(51) Int. Cl.
*H03L 7/06*    (2006.01)
(52) U.S. Cl.
USPC .......................................... 327/158; 327/161
(58) Field of Classification Search
None
See application file for complete search history.

(56) References Cited

U.S. PATENT DOCUMENTS

| | | | | |
|---|---|---|---|---|
| 5,412,349 A | * | 5/1995 | Young et al. .................. 331/34 |
| 5,576,657 A | * | 11/1996 | Frisch et al. .................. 327/543 |
| 5,644,261 A | * | 7/1997 | Frisch et al. .................. 327/277 |
| 6,677,791 B2 | * | 1/2004 | Okuda et al. .................. 327/158 |
| 6,937,076 B2 | * | 8/2005 | Gomm .......................... 327/158 |
| 7,622,969 B2 | * | 11/2009 | Johnson ........................ 327/158 |
| 2009/0284295 A1 | * | 11/2009 | Diewald et al. ............... 327/241 |
| 2009/0289673 A1 | * | 11/2009 | Chiu ............................. 327/157 |

FOREIGN PATENT DOCUMENTS

| | | |
|---|---|---|
| JP | 2002-152018 | 5/2002 |
| KR | 1020030056461 | 7/2003 |
| KR | 100789408 | 12/2007 |
| KR | 1020070114835 | 12/2007 |

OTHER PUBLICATIONS

Notice of Preliminary Rejection issued from Korean Intellectual Property Office on Apr. 8, 2011.
Office Action issued by the Korean Intellectual Property Office on Dec. 30, 2011.
Notice of Allowance issued by the Korean Intellectual Property Office on Mar. 29, 2013.

* cited by examiner

*Primary Examiner* — Cassandra Cox
(74) *Attorney, Agent, or Firm* — IP & T Group LLP

(57) ABSTRACT

An internal clock signal generation circuit is capable of controlling a unit delay time depending on a frequency of an external clock signal. The internal clock signal generation circuit includes an internal clock signal generation unit configured to generate an internal clock signal corresponding to a plurality of unit delay cells enabled in response to a control signal, and a unit delay time control unit configured to detect a frequency of an external clock signal and control a unit delay time of each of the plurality of unit delay cells.

29 Claims, 3 Drawing Sheets

INTERNAL CLOCK SIGNAL GENERATOR AND OPERATING METHOD THEREOF

CROSS-REFERENCE(S) TO RELATED APPLICATIONS

The present application claims priority of Korean Patent Application No. 10-2009-0132039, filed on Dec. 28, 2009, which is incorporated herein by reference in its entirety.

BACKGROUND OF THE INVENTION

Exemplary embodiments of the present invention relate to a semiconductor design technology, and more particularly, to an internal clock signal generation circuit for generating an internal clock signal, and a method for operating the same.

Generally, a semiconductor device, including a Double Data Rate Synchronous DRAM (DDR SDRAM), receives an external clock signal to generate an internal clock signal, and uses the generated internal clock signal as a reference for a synchronization of various operations within the semiconductor device. Therefore, the internal clock signal generation circuit for generating the internal clock signal is included in the semiconductor device. Examples of the internal clock signal generation circuit include a Delay Locked Loop (DLL) and a Phase Locked Loop (PLL). Hereinafter, for the sake of convenience, reference is only made to the delay locked loop.

FIG. 1 is a block diagram of a conventional delay locked loop.

Referring to FIG. 1, the conventional delay locked loop includes a variable delay unit 110, a delay replica modeling unit 120, a phase detection unit 130, and a control signal generation unit 140.

The variable delay unit 110 is configured to delay an external clock signal CLK_EXT by a time corresponding to delay control signals SH0 to SHN (where N is a positive integer) to generate a DLL clock signal CLK_DLL. The generated DLL clock signal CLK_DLL is inputted to the delay replica modeling unit 120. A clock path and a data path within the semiconductor device are modeled in the delay replica modeling unit 120. The DLL clock signal CLK_DLL is delayed by a modeled time of the delay replica modeling unit 120 and is outputted as a feedback clock signal CLK_FED. The phase detection unit 130 is configured to compare a phase of the external clock signal CLK_EXT with a phase of the feedback clock signal CLK_FED, and generate a phase detection signal DET_PHS corresponding to the comparison result. The control signal generation unit 140 is configured to generate the delay control signals SH0 to SHN in response to the phase detection signal DET_PHS. The delay control signals SH0 to SHN generated in this manner are used to control the delay amount applied to the variable delay unit 110.

Generally, the variable delay unit 110 is implemented with a plurality of unit delay cells. Each of the unit delay cells has a predetermined delay time (hereinafter, referred to as a unit delay time). Herein, the unit delay time is determined in the design stage.

According to the above-mentioned structure, the conventional delay locked loop generates the delay control signals SH0 to SHN which synchronize the phases of the external clock signal CLK_EXT with the feedback clock signal CLK_FED, and generates the DLL clock signal CLK_DLL corresponding to the delay control signals SH0 to SHN. Herein, a state where two phases are synchronized with each other is called 'locking'. When a locking operation is completed, the DLL clock signal CLK_DLL is transferred to a data output circuit, and data are outputted in synchronization with the transferred DLL clock signal CLK_DLL. The data outputted in synchronization with the DLL clock signal act as if they are outputted in synchronization with the external clock signal CLK_EXT.

Meanwhile, the conventional delay locked loop has a typical slowdown concern in the locking operation when the external clock signal CLK_EXT has a low frequency. That is, while the delay time that the variable delay unit 110 should provide is increased in response to the low-frequency external clock signal CLK_EXT, the unit delay time of the unit delay cell is too small. Of course, this concern may be addressed by designing the unit delay cell to have a greater unit delay time necessary to prepare for the low-frequency external clock signal CLK_EXT. However, this method does not guarantee a desired locking operation in the case of a high-frequency external clock signal CLK_EXT.

SUMMARY OF THE INVENTION

Exemplary embodiments of the present invention are directed to an internal clock signal generation circuit capable of controlling a unit delay time depending on a frequency of an external clock signal, and a method for operating the same.

In accordance with an embodiment of the present invention, an internal clock signal generation circuit includes an internal clock signal generation unit configured to generate an internal clock signal corresponding to a plurality of unit delay cells enabled in response to a control signal, and a unit delay time control unit configured to detect a frequency of an external clock signal and control a unit delay time of each of the plurality of unit delay cells.

In accordance with another embodiment of the present invention, an internal clock signal generation circuit includes a variable delay unit configured to delay an external clock signal by a time corresponding to delay control signals, and generate an internal clock signal, wherein the variable delay unit comprises a plurality of unit delay cells, a modeling unit configured to delay the internal clock signal by a time obtained by modeling a clock path and a data path, and generate a feedback clock signal, a phase detection unit configured to compare a phase of the external clock signal with a phase of the feedback clock signal, and generate a phase detection signal, a control signal generation unit configured to generate the delay control signals in response to the phase detection signal, and a unit delay time control unit configured to detect a frequency of the external clock signal and control a unit delay time of each of the plurality of unit delay cells.

In accordance with still another embodiment of the present invention, an internal clock signal generation circuit includes a phase/frequency detection unit configured to compare a phase/frequency difference between an external clock signal and an internal clock signal, and output a detection signal, a control signal generation unit configured to generate frequency control signals in response to the detection signal, an oscillating unit configured to generate the internal clock signal having a frequency that corresponds to the frequency control signals, wherein the oscillating unit comprises a plurality of unit delay cells, and a unit delay time control unit configured to detect a frequency of the external clock signal and control a unit delay time of each of the plurality of unit delay cells.

In accordance with still another embodiment of the present invention, a method for operating an internal clock signal generation circuit includes generating a frequency detection signal corresponding to a frequency of an external clock signal, controlling a unit delay time in response to the frequency detection signal, and controlling a number of enabled unit delay cells among a plurality of unit delay cells to which the unit delay time is applied to perform a locking operation.

DESCRIPTION OF SPECIFIC EMBODIMENTS

Figure 1:
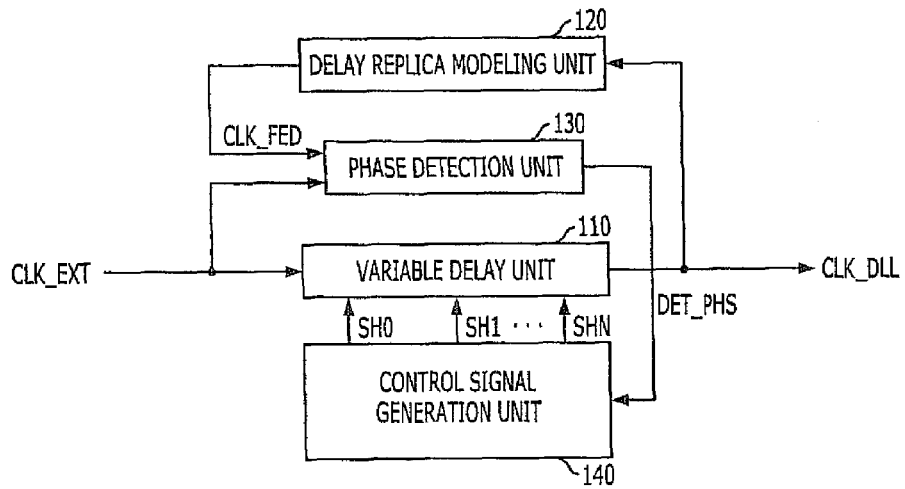
FIG. 1 is a block diagram of a conventional delay locked loop.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
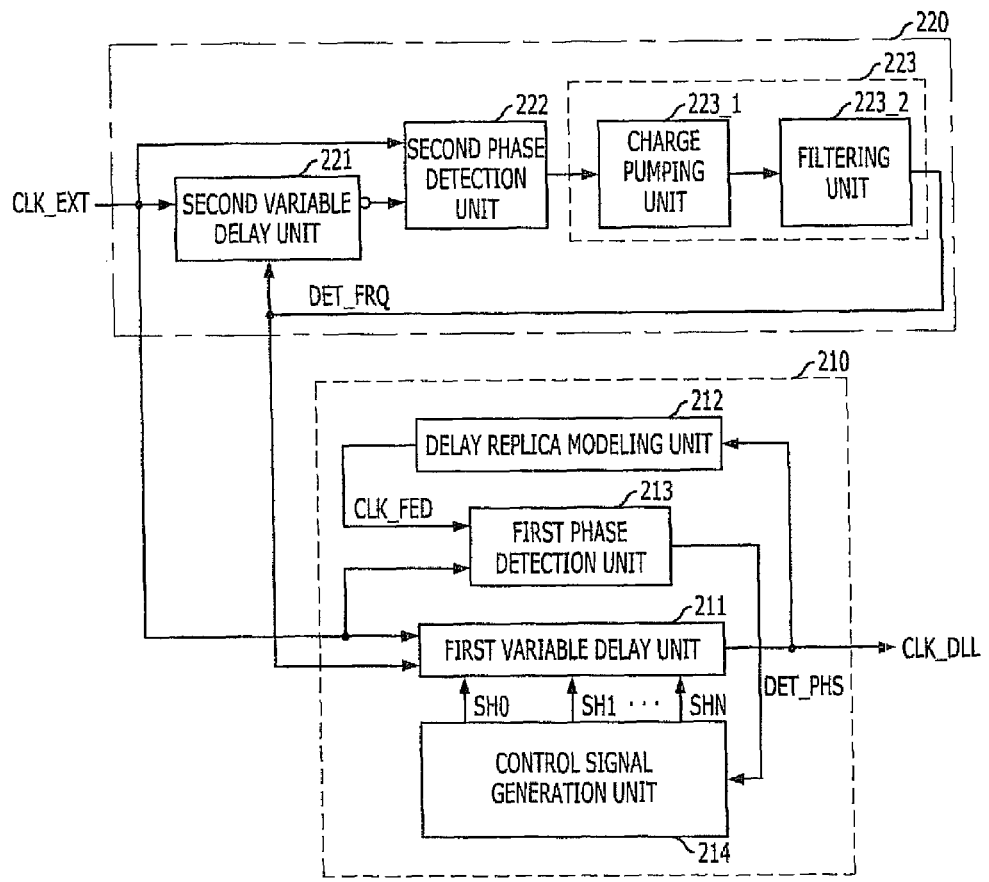
FIG. 2 is a block diagram of an internal clock signal generation circuit in accordance with an embodiment of the present invention.

FIG. 2 is a block diagram of an internal clock signal generation circuit in accordance with an embodiment of the present invention, wherein the internal clock signal generation circuit includes, for example, a delay locked loop.

Referring to FIG. 2, the internal clock signal generation circuit includes an internal clock signal generation unit 210 and a unit delay time control unit 220. Herein, for example, the internal clock signal generation unit 210 corresponds to the delay locked loop.

The internal clock signal generation unit 210 is configured to generate a DLL clock signal CLK_DLL by utilizing a plurality of unit delay cells, which are enabled in response to delay control signals SH0 to SHN. The internal clock signal generation unit 210 includes a first variable delay unit 211, a delay replica modeling unit 212, a first phase detection unit 213, and a control signal generation unit 214.

Each constituent element of the internal clock signal generation unit 210 will be described below.

The first variable delay unit 211 is configured to delay an external clock signal CLK_EXT by a time corresponding to the delay control signals SH0 to SHN, and generate the DLL clock signal CLK_DLL. The first variable delay unit 211 is implemented with a plurality of unit delay cells, which are enabled in response to the delay control signals SH0 to SHN. Further, a unit delay time of the plurality of unit delay cells is controlled by a frequency detection signal DET_FRQ.

A clock path and a data path within a semiconductor device are modeled in the delay replica modeling unit 212. The DLL clock signal CLK_DLL is delayed by a modeled time of the delay replica modeling unit 212, and outputted as a feedback clock signal CLK_FED. Herein, the delay replica modeling unit 212 may model a path where the external clock signal CLK_EXT inputted externally is transferred to the delay locked loop; a path where the DLL clock signal CLK_DLL generated in the delay locked loop is transferred to a driver for outputting data; and a path where the data are transferred to be synchronized with the DLL clock signal CLK_DLL.

The first phase detection unit 213 is configured to compare a phase of the external clock signal CLK_EXT with a phase of the feedback clock signal CLK_FED, and generate a phase detection signal DETPHS. The phase detection signal DET_PHS is a signal that depends on whether the phase of the feedback clock signal CLK_FED leads or lags behind the phase of the external clock signal CLK_EXT.

The control signal generation unit 214 is configured to generate the delay control signals SH0 to SHN in response to the phase detection signal DET_PHS. The delay control signals SH0 to SHN determine the number of enabled unit delay cells among the plurality of unit delay cells included in the first variable delay unit 211. Accordingly, the delay amount of the first variable delay unit 212 is determined depending on the delay control signals SH0 to SHN.

Meanwhile, the unit delay time control unit 220 is configured to detect a frequency of the external clock signal CLK_EXT and control the unit delay time of the first variable delay unit 211. The unit delay time control unit 220 includes a second variable delay unit 221, a second phase detection unit 222, and a detection signal generation unit 223. The internal clock signal generation circuit in accordance with the embodiment of the present invention controls the unit delay time of the first variable delay unit 211 depending on the frequency of the external clock signal CLK_EXT. Therefore, the first variable delay unit 211 receives the frequency detection signal DET_FRQ in addition to the delay control signals SH0 to SHN.

Each constituent element of the unit delay time control unit 220 will be described below.

The second variable delay unit 221 delays the external clock signal CLK_EXT by a time corresponding to the frequency detection signal DET_FRQ. At this time, the second variable delay unit 221 outputs an inverted version of the delayed external clock signal. A more detailed explanation about the function of the second variable delay unit 221 will be provided further below.

The second phase detection unit 222 detects phases of the external clock signal CLK_EXT and the output signal of the second variable delay unit 221. The detection signal generation unit 223 generates the frequency detection signal DET_FRQ, which has a voltage level corresponding to an output signal of the second phase detection unit 222. Herein, the detection signal generation unit 223 includes a charge pumping unit 223_1 and a filtering unit 223_2. The charge pumping unit 223_1 forms a charging path or a discharging path in response to the output signal of the second phase detection unit 222. The filtering unit 223_2 generates the frequency detection signal DET_FRQ through a charging/discharging operation corresponding to the charging path or the discharging path formed at the charge pumping unit 223_1.

The operation of the unit delay time control unit 220 in accordance with the embodiment of the present invention is described as follows.

First, the second variable delay unit 221 outputs the inverted version of the external clock signal CLK_EXT, and the second phase detection unit 222 compares the phase of the external clock signal CLK_EXT with the phase of the output signal of the second variable delay unit 221, and generates a corresponding output signal. The detection signal generation unit 223 generates the frequency detection signal DET_FRQ whose voltage level corresponds to the output signal of the second phase detection unit 222. The frequency detection signal DET_FRQ is fed back to the second variable unit 221, so that the delay amount of the second variable delay unit 221 is adjusted again.

In this manner, the phases of the external clock signal CLK_EXT and the output signal of the second variable delay unit 221 become the same as each other. That is, the delay amount of the second variable delay unit 221 determined in response to the frequency detection signal DET_FRQ corresponds to ½ of tCK (the time of one period) of the external clock signal CLK_EXT. In other words, the frequency detection signal DET_FRQ represents tCK information of the external clock signal CLK_EXT as a voltage value, and therefore, also represents frequency information of the external clock signal CLK_EXT as a voltage value. Accordingly, the frequency detection signal DET_FRQ has the voltage level corresponding to tCK of the external clock signal CLK_EXT (i.e., the frequency of the external clock signal CLK_EXT).

Herein, the second variable delay unit 221 outputs the inverted delayed clock signal, so that the second variable delay unit 221 can secure the delay amount corresponding to ½ of tCK of the external clock signal CLK_EXT. Although a desired delay amount may be changed according to a design of the second variable delay unit 221 (for example, the second variable delay unit 221 may be designed to secure a delay amount corresponding to ¼ of tCK of the external clock signal CLK_EXT).

Meanwhile, the unit delay time of the first variable delay unit 211 included in the internal clock signal generation unit 210 is controlled in response to the frequency detection signal DET_FRQ. That is, the frequency detection signal DET_FRQ has voltage levels corresponding to each of a low-frequency external clock signal CLK_EXT and a high-frequency external clock signal CLK_EXT. According to the voltage level, the unit delay time of the unit delay cells included in the first variable delay unit 211 is changed. More specifically, the unit delay time is increased in response to the low-frequency external clock signal CLK_EXT, and the unit delay time is decreased in response to the high-frequency external clock signal CLK_EXT.

Therefore, the internal clock signal generation circuit in accordance with the embodiment of the present invention can adjust the unit delay time depending on the frequency of the external clock signal CLK_EXT. Thereafter, the internal clock signal generation circuit adjusts the number of enabled unit delay cells having the adjusted unit delay time in order to perform the locking operation. This means that a fast completion of the locking operation can be secured when the external clock signal CLK_EXT has a low-frequency, while the locking operation can be performed with greater sensitivity when the external clock signal CLK_EXT has a high-frequency.

Also, as mentioned above, the unit delay time of the unit delay cell is determined in connection with the frequency of the external clock signal CLK_EXT. Thus, influences on the circuit due to the change of environment, such as process, voltage, and temperature, can be minimized.

Figure 3:
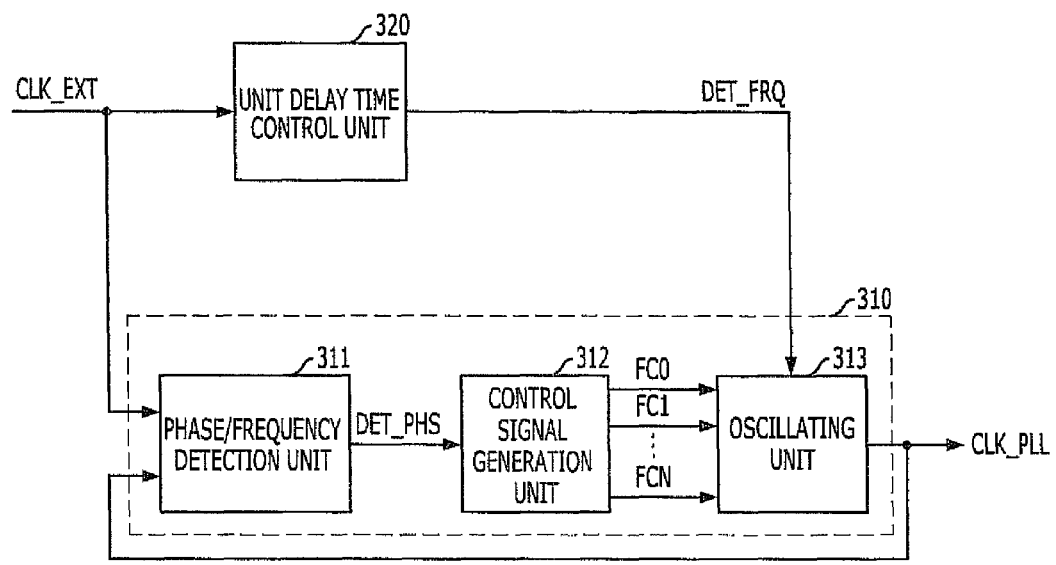
FIG. 3 is a block diagram of an internal clock signal generation circuit in accordance with another embodiment of the present invention.

FIG. 3 is a block diagram of an internal clock signal generation circuit in accordance with another embodiment of the present invention, wherein the internal clock signal generation circuit includes, for example, a phase locked loop.

Referring to FIG. 3, the internal clock signal generation circuit includes an internal clock signal generation unit 310 and a unit delay time control unit 320. Herein, the internal clock signal generation unit 310 corresponds to the phase locked loop. For reference, a circuit configuration and a circuit operation of the unit delay time control unit 320 are the same as that of the unit delay time control unit 220 shown in FIG. 2. Therefore, only the internal clock signal generation unit 310 is described below.

The internal clock signal generation unit 310 is configured to generate a PLL clock signal CLK_PLL using a plurality of unit delay cells enabled in response to frequency control signals FC0 to FCN. The internal clock signal generation unit 310 includes a phase/frequency detection unit 311, a control signal generation unit 312, and an oscillating unit 313.

The phase/frequency detection unit 311 is configured to compare a phase/frequency of the external clock signal CLK_EXT with a phase/frequency of the PLL clock signal CLK_PLL, and output a phase/frequency detection signal DET_PHS. The phase/frequency detection signal DET_PHS is outputted as a signal which corresponds to a phase/frequency difference between the external clock signal CLK_EXT and the PLL clock signal CLK_PLL.

The control signal generation unit 312 is configured to generate the frequency control signals FC0 to FCN (where N is a positive integer) in response to the phase/frequency detection signal DET_PHS. The frequency control signals FC0 to FCN determine the number of enabled unit delay cells among a plurality of delay cells included in the oscillating unit 313.

The oscillating unit 313 generates the PLL clock signal CLK_PLL whose frequency corresponds to the frequency control signals FC0 to FCN. Herein, the oscillating unit 313 determines the number of unit delay cells to be enabled/utilized depending on the frequency control signals FC0 to FCN, and generates the PLL clock signal CLK_PLL whose frequency corresponds to the number of enabled/utilized unit delay cells. Additionally, the oscillating unit 313 in accordance with the embodiment of the present invention receives a frequency detection signal DET_FRQ, so that the unit delay time of the unit delay cells is adjusted depending on the frequency detection signal DET_FRQ, in a manner similar to that of the first variable delay unit 211 shown in FIG. 2.

For reference, in the case of the phase locked loop, it is called 'locking' when the phases/frequencies of the external clock signal CLK_EXT and the PLL clock signal CLK_PLL become the same. If the external clock signal CLK_EXT or the PLL clock signal CLK_PLL is divided, the locking operation is performed accordingly.

Meanwhile, a method for adjusting the unit delay time of the unit delay cells of the first variable delay unit 211 illustrated in FIG. 2 and the unit delay cells of the oscillating unit 313 illustrated in FIG. 3 can be varied according to a design of the particular unit delay cells. One example of the method for adjusting the unit delay time is described below with reference to FIGS. 4 and 5.

Figure 4:
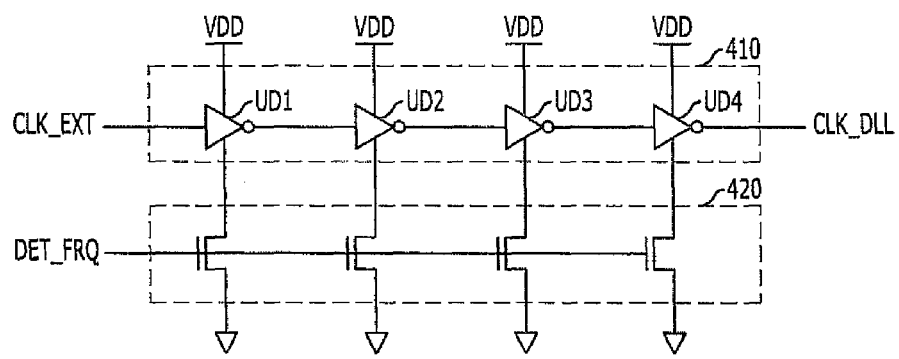
FIG. 4 is a circuit diagram illustrating a unit delay cell of a first variable delay unit shown in FIG. 2.

FIG. 4 is a circuit diagram illustrating the unit delay cell of the first variable delay unit 211 shown in FIG. 2. It is assumed that the number of unit delay cells to be enabled by the delay control signals SH0 to SHN (not shown) is 4. Also, it is assumed that the frequency detection signal DET_FRQ has a high voltage level corresponding to the high-frequency external clock signal CLK_EXT, and has a low voltage level corresponding to the low-frequency external clock signal CLK_EXT.

Referring to FIG. 4, the first variable delay unit 211 includes a delay unit 410 and a driving strength adjusting unit 420. The delay unit 410 receives the external clock signal CLK_EXT, and includes a plurality of unit delay cells UD1 to UD4. The driving strength adjusting unit 420 is configured to adjust a driving strength of the delay unit 410 in response to the frequency detection signal DET_FRQ. Herein, the plurality of unit delay cells UD1 to UD4 can be implemented with inverters connected in series. The driving strength adjusting unit 420 can be implemented with n-type metal oxide semiconductor (NMOS) transistors whose source-drain paths are formed between the plurality of unit delay cells UD1 to UD4 and a ground voltage terminal VSS, and whose gates receive the frequency detection signal DET_FRQ.

Meanwhile, each driving strength of the unit delay cells UD1 to UD4 is varied depending on a turn-on degree of the NMOS transistor, and the turn-on degree of the NMOS transistor is changed depending on the voltage level of the frequency detection signal DET_FRQ. In other words, when the voltage level of the frequency detection signal DET_FRQ becomes low corresponding to the low-frequency external clock signal CLK_EXT, each driving strength of the unit delay cells UD1 to UD4 is decreased, and accordingly, the unit delay time becomes longer. On the contrary, when the voltage level of the frequency detection signal DET_FRQ becomes high corresponding to the high-frequency external clock signal CLK_EXT, each driving strength of the unit delay cells UD1 to UD4 is increased, and accordingly, the unit delay time becomes shorter.

That is, the driving strength of each unit delay cells UD1 to UD4 is determined depending on the voltage level of the frequency detection signal DET_FRQ. This means that the unit delay time can be adjusted according to the frequency detection signal DET_FRQ. As a result, the internal clock signal generation circuit in accordance with the embodiment of the present invention can generate a desired DLL clock signal fast and stably by adjusting the unit delay time according to the frequency detection signal DET_FRQ, which is determined from the frequency of the external clock signal CLK_EXT.

Figure 5:
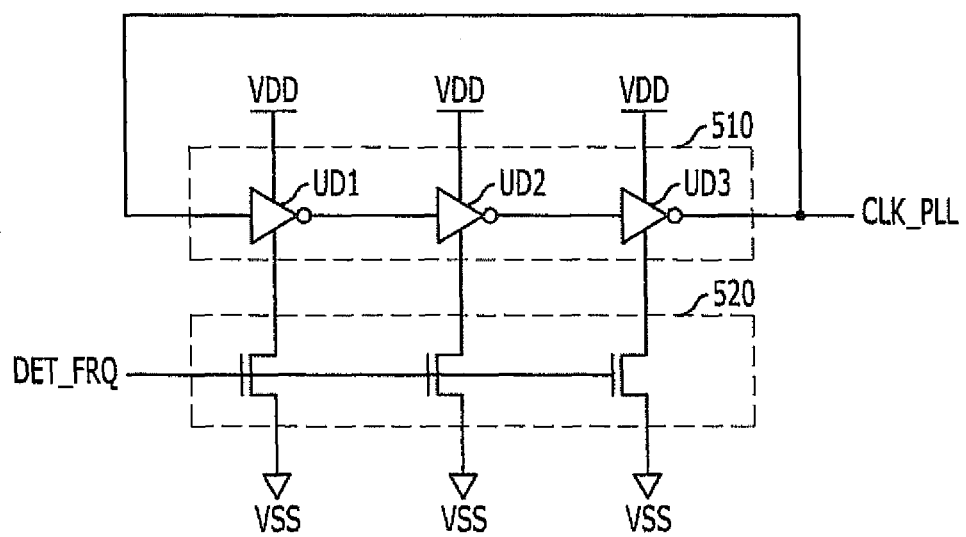
FIG. 5 is a circuit diagram illustrating a unit delay cell of an oscillating unit shown in FIG. 3.

FIG. 5 is a circuit diagram illustrating the unit delay cell of the oscillating unit 313 shown in FIG. 3. Here, it is assumed that the number of unit delay cells to be enabled by the frequency control signals FC0 to FCN (not shown) is 3.

Referring to FIG. 5, the oscillating unit 313 includes a delay unit 510 and a driving strength adjusting unit 520. The delay unit 510 includes a plurality of unit delay cells UD1 to UD3. The driving strength adjusting unit 520 is configured to adjust a driving strength of the delay unit 510 in response to a frequency detection signal DET_FRQ. Herein, the oscillating unit 313 receives a fed-back PLL clock signal CLK_PLL to perform an oscillating operation. In other words, the signal output from the delay unit 510 is coupled to the input of the delay unit 510. For example, in FIG. 5 the output of the unit delay cell UD3 is inputted to the unit delay cell UD1.

Similar to the above-mentioned description with reference to FIG. 4, a driving strength of each of the unit delay cells UD1 to UD3 is determined depending on the voltage level of the frequency detection signal DET_FRQ, and changes to the driving strength make it possible to adjust the unit delay time. As a result, the internal clock signal generation circuit in accordance with the embodiment of the present invention can generate a desired PLL clock signal fast and stably by adjusting the unit delay time according to the frequency detection signal DET_FRQ, which is determined from the frequency of the external clock signal CLK_EXT.

As mentioned above, the internal clock signal generation circuit in accordance with the embodiment of the present invention can adjust the unit delay time of the unit delay cells used for generating the internal clock signal depending on the frequency of the external clock signal CLK_EXT. Accordingly, a faster locking operation can be guaranteed even in response to the low-frequency external clock signal CLK_EXT. Further, in the case of the high-frequency external clock signal CLK_EXT, a more accurate locking operation can be guaranteed.

In accordance with the exemplary embodiments of the present invention, responding to all of the high-frequency and low-frequency external clock signals, the internal clock signal is generated through the fast and stable locking operation. Hence, the internal clock signal may be generated and used at earlier time.

Moreover, since the unit delay time of the unit delay cells depends on the frequency of the external clock signal, the desired locking operation can be performed, without regard to the change of environment which influences the circuits.

While the present invention has been described with respect to the specific embodiments, it will be apparent to those skilled in the art that various changes and modifications may be made without departing from the spirit and scope of the invention as described in the following claims.

What is claimed is:

1. An internal clock signal generation circuit, comprising:
   an internal clock signal generation unit, having a plurality of first unit delay cells, configured to generate an internal clock signal corresponding to the plurality of first unit delay cells enabled in response to a control signal and a frequency detection signal; and
   a unit delay time control unit, having a plurality of second unit delay cells, configured to generate the frequency detection signal corresponding to a frequency of the external clock signal based on a comparison result between a phase of the external clock signal with a phase of a delayed external clock signal and control a unit delay time of each of the plurality of first unit delay cells depending on a frequency of an external clock signal.

2. The internal clock signal generation circuit of claim 1, wherein the unit delay time control unit is configured to provide the frequency detection signal to the internal clock signal generation unit.

3. The internal clock signal generation circuit of claim 2, wherein the frequency detection signal has a voltage level corresponding to the frequency of the external clock signal.

4. The internal clock signal generation circuit of claim 2, wherein the unit delay time control unit comprises:
   a variable delay unit configured to delay the external clock signal by a time corresponding to the frequency detection signal, and output a delayed external clock signal;
   a phase detection unit configured to compare a phase of the external clock signal with a phase of the delayed external clock signal; and
   a detection signal generation unit configured to generate the frequency detection signal in response to an output signal of the phase detection unit.

5. The internal clock signal generation circuit of claim 4, wherein the variable delay unit is configured to invert the delayed external clock signal to be outputted.

6. The internal clock signal generation circuit of claim 4, wherein the time corresponding to the frequency detection signal is defined in response to the frequency of the external clock signal.

7. The internal clock signal generation circuit of claim 4, wherein the detection signal generation unit comprises:
   a charge pumping unit configured to form a charging path or a discharging path in response to the output signal of the phase detection unit; and
   a filtering unit configured to generate the frequency detection signal through a charging or discharging operation which corresponds to the charging path or the discharging path of the charge pumping unit, respectively.

8. An internal clock signal generation circuit, comprising:
   a variable delay unit configured to delay an external clock signal by a time corresponding to delay control signals, and generate an internal clock signal, wherein the variable delay unit comprises a plurality of unit delay cells;
a modeling unit configured to delay the internal clock signal by a time obtained by modeling a clock path and a data path, and generate a feedback clock signal;
a phase detection unit configured to compare a phase of the external clock signal with a phase of the feedback clock signal, and generate a phase detection signal;
a control signal generation unit configured to generate the delay control signals in response to the phase detection signal; and
a unit delay time control unit configured to detect a frequency of the external clock signal and control a unit delay time of each of the plurality of unit delay cells.

9. The internal clock signal generation circuit of claim 8, wherein the variable delay unit comprises:
a delay unit configured to delay the external clock signal by the time corresponding to the delay control signals, and generate the internal clock signal, wherein the delay unit includes the plurality of unit delay cells connected in series; and
a driving strength adjusting unit configured to adjust a driving strength of the delay unit corresponding to the frequency of the external clock signal.

10. The internal clock signal generation circuit of claim 8, wherein a number of enabled unit delay cells among the plurality of unit delay cells is determined in response to the delay control signals.

11. The internal clock signal generation circuit of claim 8, wherein the unit delay time control unit is configured to generate a frequency detection signal corresponding to the frequency of the external clock signal, and provide the frequency detection signal to the variable delay unit.

12. The internal clock signal generation circuit of claim 11, wherein the frequency detection signal has a voltage level corresponding to the frequency of the external clock signal.

13. The internal clock signal generation circuit of claim 11, wherein the unit delay time control unit comprises:
a second variable delay unit configured to delay the external clock signal by a time corresponding to the frequency detection signal and output a delayed external clock signal;
a second phase detection unit configured to compare a phase of the external clock signal with a phase of the delayed external clock signal; and
a detection signal generation unit configured to generate the frequency detection signal in response to an output signal of the second phase detection unit.

14. The internal clock signal generation circuit of claim 13, wherein the second variable delay unit is configured to invert the delayed external clock signal to be outputted.

15. The internal clock signal generation circuit of claim 13, wherein the time corresponding to the frequency detection signal is defined in response to the frequency of the external clock signal.

16. The internal clock signal generation circuit of claim 13, wherein the detection signal generation unit comprises:
a charge pumping unit configured to form a charging path or a discharging path in response to the output signal of the second phase detection unit; and
a filtering unit configured to generate the frequency detection signal through a charging or discharging operation which corresponds to the charging path or the discharging path of the charge pumping unit, respectively.

17. An internal clock signal generation circuit, comprising:
a phase/frequency detection unit configured to compare a phase/frequency difference between an external clock signal and an internal clock signal, and output a detection signal;
a control signal generation unit configured to generate frequency control signals in response to the detection signal;
an oscillating unit configured to generate the internal clock signal having a frequency that corresponds to the frequency control signals, wherein the oscillating unit comprises a plurality of unit delay cells; and
a unit delay time control unit configured to detect a frequency of the external clock signal and control a unit delay time of each of the plurality of unit delay cells.

18. The internal clock signal generation circuit of claim 17, wherein the oscillating unit comprises:
a delay unit configured to delay the external clock signal by a time corresponding to the frequency control signals to obtain a delayed external clock signal, and receive a fed-back signal, which is the delayed external clock signal, to generate the internal clock signal, wherein the delay unit includes the plurality of unit delay cells connected in series; and
a driving strength adjusting unit configured to adjust a driving strength of the delay unit corresponding to the frequency of the external clock signal.

19. The internal clock signal generation circuit of claim 17, wherein a number of enabled unit delay cells among the plurality of unit delay cells is determined in response to the frequency control signals.

20. The internal clock signal generation circuit of claim 17, wherein the unit delay time control unit is configured to generate a frequency detection signal corresponding to the frequency of the external clock signal, and provide the frequency detection signal to the oscillating unit.

21. The internal clock signal generation circuit of claim 20, wherein the frequency detection signal has a voltage level corresponding to the frequency of the external clock signal.

22. The internal clock signal generation circuit of claim 20, wherein the unit delay time control unit comprises:
a variable delay unit configured to delay the external clock signal by a time corresponding to the frequency detection signal and output a delayed external clock signal;
a phase detection unit configured to compare a phase of the external clock signal with a phase of the delayed external clock signal; and
a detection signal generation unit configured to generate the frequency detection signal in response to an output signal of the phase detection unit.

23. The internal clock signal generation circuit of claim 22, wherein the variable delay unit is configured to invert the delayed external clock signal to be outputted.

24. The internal clock signal generation circuit of claim 22, wherein the time corresponding to the frequency detection signal is defined according to the frequency of the external clock signal.

25. The internal clock signal generation circuit of claim 22, wherein the detection signal generation unit comprises:
a charge pumping unit configured to form a charging path or a discharging path in response to the output signal of the phase detection unit; and
a filtering unit configured to generate the frequency detection signal through a charging or discharging operation which corresponds to the charging path or the discharging path of the charge pumping unit, respectively.

26. A method for operating an internal clock signal generation circuit, comprising:
 generating a frequency detection signal corresponding to a frequency of an external clock signal;
 controlling a unit delay time in response to the frequency detection signal; and
 controlling a number of enabled unit delay cells among a plurality of unit delay cells to which the unit delay time is applied to perform a locking operation,
 wherein the unit delay time of each of the plurality of unit delay cells corresponds to the frequency of the external clock signal.

27. The method of claim 26, wherein the generating of the frequency detection signal comprises defining a delay amount corresponding to the frequency of the external clock signal, the defining of the delay amount includes:
 delaying the external clock signal by a time corresponding to the frequency detection signal; and
 comparing a phase of a delayed external clock signal with a phase of the external clock signal to keep or stop delaying the external clock signal.

28. The method of claim 27, wherein the delaying of the external clock signal comprises delaying and inverting the external clock signal.

29. The method of claim 26, wherein the frequency detection signal has a voltage level corresponding to the frequency of the external clock signal.

* * * * *